(12) United States Patent
Kobatake

(10) Patent No.: US 8,143,910 B2
(45) Date of Patent: Mar. 27, 2012

(54) SEMICONDUCTOR INTEGRATED CIRCUIT AND METHOD OF TESTING THE SAME

(75) Inventor: Hiroyuki Kobatake, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 459 days.

(21) Appl. No.: 12/457,550

(22) Filed: Jun. 15, 2009

(65) Prior Publication Data

US 2010/0007368 A1  Jan. 14, 2010

(30) Foreign Application Priority Data

Jul. 10, 2008  (JP) .................................. 2008-179889

(51) Int. Cl.
*G01R 31/34* (2006.01)

(52) U.S. Cl. ................ 324/765.01; 324/606; 324/76.54; 324/555; 324/605; 324/617; 438/309; 438/310; 438/328; 438/329; 716/100; 716/101; 716/102

(58) Field of Classification Search .................. 324/606, 324/76.54, 555, 605, 617, 765.01; 438/309–310, 438/328–329; 716/100–102

See application file for complete search history.

(56) References Cited

U.S. PATENT DOCUMENTS

| | | | | |
|---|---|---|---|---|
| 3,409,826 A | * | 11/1968 | Goodman | 324/638 |
| 3,781,529 A | * | 12/1973 | Abramson et al. | 377/5 |
| 3,932,746 A | * | 1/1976 | Swanson | 250/221 |
| 5,381,100 A | * | 1/1995 | Hayashi | 324/601 |
| 7,102,361 B2 | * | 9/2006 | Lin | 324/601 |
| 7,884,619 B1 | * | 2/2011 | Chong et al. | 324/601 |
| 8,001,502 B2 | * | 8/2011 | Chang | 716/104 |
| 2001/0014851 A1 | * | 8/2001 | Krishnamoorthy | 703/19 |
| 2001/0049814 A1 | * | 12/2001 | Matsumoto et al. | 716/10 |
| 2004/0117742 A1 | * | 6/2004 | Emberling et al. | 716/1 |
| 2004/0124852 A1 | * | 7/2004 | Higashide et al. | 324/617 |
| 2010/0020624 A1 | * | 1/2010 | Mayor | 365/189.15 |

FOREIGN PATENT DOCUMENTS

JP  10-242392  9/1998

OTHER PUBLICATIONS

Lee et al., "A Novel High Speed Low Power Logic Family: Race Logic", Solid-State Circuits Conference 2000, pp. 419-422.*
Lee et al., "Race Logic Architecture (RALA): A Novel Logic Concept Using the Race Scheme of Input Variables", IEEE Journal of Solid-State Circuits, vol. 37, No. 2, Feb. 2002, pp. 191-201.*
Huang et al., "Timing Optimization for Testable Convergent Tree Adders", ASIC Conference 1998, pp. 245-249.*

* cited by examiner

*Primary Examiner* — Jermele M Hollington
*Assistant Examiner* — Lamarr Brown
(74) *Attorney, Agent, or Firm* — McGinn IP Law Group, PLLC

(57) ABSTRACT

Provided is a semiconductor integrated circuit including: a first path that includes a first logic circuit; a second path that includes a second logic circuit; and a subsequent-stage circuit that is connected to an output of the first path and is connected to an output of the second path, in which the second path further includes a first internal path that is selected as a propagation path during a normal operation period; and a second internal path that is selected as a propagation path during a test operation period and includes a delay circuit having a delay amount larger than a delay amount of the first internal path.

11 Claims, 7 Drawing Sheets

CASE WHERE UNEXPECTED DELAY OCCURS IN LOGIC CIRCUIT 12
(TEST CIRCUIT 16 IS NOT PROVIDED)

OPERATION TEST IS PASSED

CASE WHERE UNEXPECTED DELAY OCCURS IN LOGIC CIRCUIT 12
(TEST CIRCUIT 16 IS PROVIDED)

OPERATION TEST IS FAILED

SEMICONDUCTOR INTEGRATED CIRCUIT AND METHOD OF TESTING THE SAME

BACKGROUND

1. Field of the Invention

The present invention relates to a semiconductor integrated circuit and a method of testing the same. In particular, the present invention relates to a semiconductor integrated circuit including a racing circuit, and a method of testing the same.

2. Description of Related Art

In recent years, significant performance improvements in semiconductor integrated circuits have been achieved. Along with the performance improvements, it becomes more important than ever to secure the reliability of semiconductor integrated circuits.

Some of the semiconductor integrated circuits have a racing circuit incorporated therein. The incorporation of the racing circuit can provide a desired logical operation with a smaller number of clocks. When a delay fault is caused in the operation of the racing circuit, however, the semiconductor integrated circuit may not function normally.

Japanese Unexamined Patent Application Publication No. 10-242392 (hereinafter, referred to as "Patent Document 1") discloses a technology for preventing racing from occurring between data and a clock signal.

As described above, when a delay fault is caused in the operation of a racing circuit, the semiconductor integrated circuit may not function normally. In view of this, in order to enhance the reliability of the semiconductor integrated circuit having the racing circuit incorporated therein, it is preferable to secure a sufficient time difference between timings at which the outputs of paths in a race condition are connected to a subsequent-stage circuit.

However, it is still not achieved to check, in a normal operation test for a semiconductor integrated circuit, whether there is a sufficient time difference between the timings at which the outputs of the racing paths are connected to the subsequent-stage circuit.

SUMMARY

The present inventor has found a problem that it is still not achieved to check, in a normal operation test for a semiconductor integrated circuit, whether there is a sufficient time difference between timings at which the outputs of paths in a race condition are connected to a subsequent-stage circuit.

A first exemplary aspect of an embodiment of the present invention is a semiconductor integrated circuit including: a first path that includes a first logic circuit; a second path that includes a second logic circuit; and a subsequent-stage circuit that is connected to an output of the first path and is connected to an output of the second path, wherein the second path further includes: a first internal path that is selected as a propagation path during a normal operation period; and a second internal path that is selected as a propagation path during a test operation period and includes a delay circuit having a delay amount larger than a delay amount of the first internal path.

A second exemplary aspect of an embodiment of the present invention is a test method including: adding a delay larger than a delay that is caused during a normal operation period, to one of first and second paths that have logic circuits respectively, based on which output thereof is connected to a subsequent-stage circuit earlier; testing an operation of a semiconductor integrated circuit including the first path, the second path, and the subsequent-stage circuit.

According to the first and second exemplary aspects of the present invention, it possible to check, in a normal test process, whether there is a sufficient time difference between timings at which the outputs of paths in a race condition are connected to the subsequent-stage circuit.

According to an exemplary embodiment of the present invention, it is achieved to check, in a normal operation test for a semiconductor integrated circuit, whether there is a sufficient time difference between the timings at which the outputs of racing paths are connected to the common subsequent-stage circuit.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
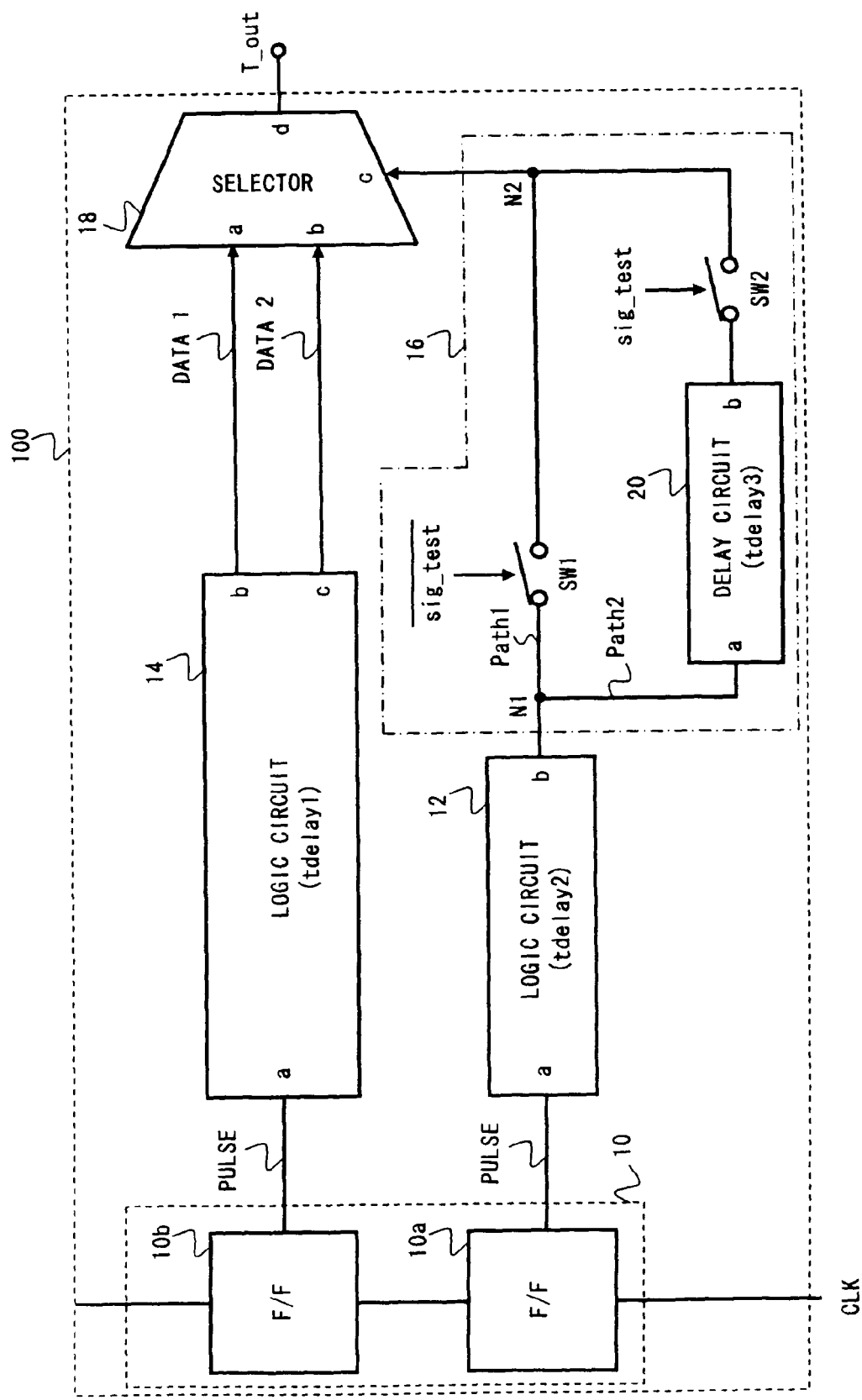
FIG. 1 is a circuit diagram schematically showing a semiconductor integrated circuit according to a first exemplary embodiment of the present invention.

Exemplary embodiments of the present invention will be described below with reference to the accompanying drawings. Note that the exemplary embodiments are simplified for ease of explanation. The drawings are in simplified form, and the technical scope of the present invention should not be interpreted to be limited to the drawings. The drawings are shown only for the purpose of illustrating the technical concept of the present invention, and the components shown in the drawings are not to scale. The identical components are denoted by the identical reference symbols, and a repeated explanation thereof is omitted.

[First Exemplary Embodiment]

Figure 2:
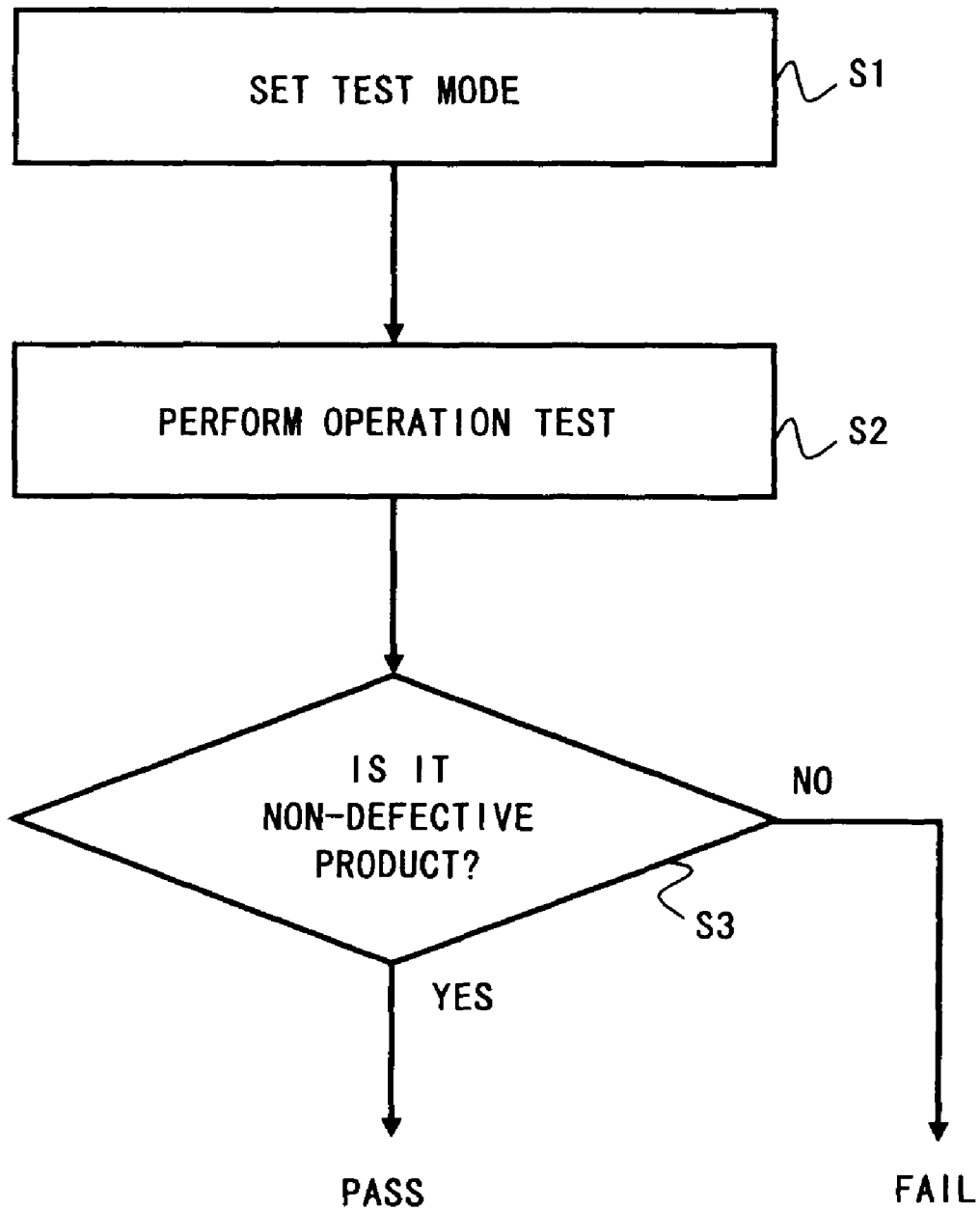
FIG. 2 is a flowchart illustrating a test process according to the first exemplary embodiment of the present invention.
Figure 3:
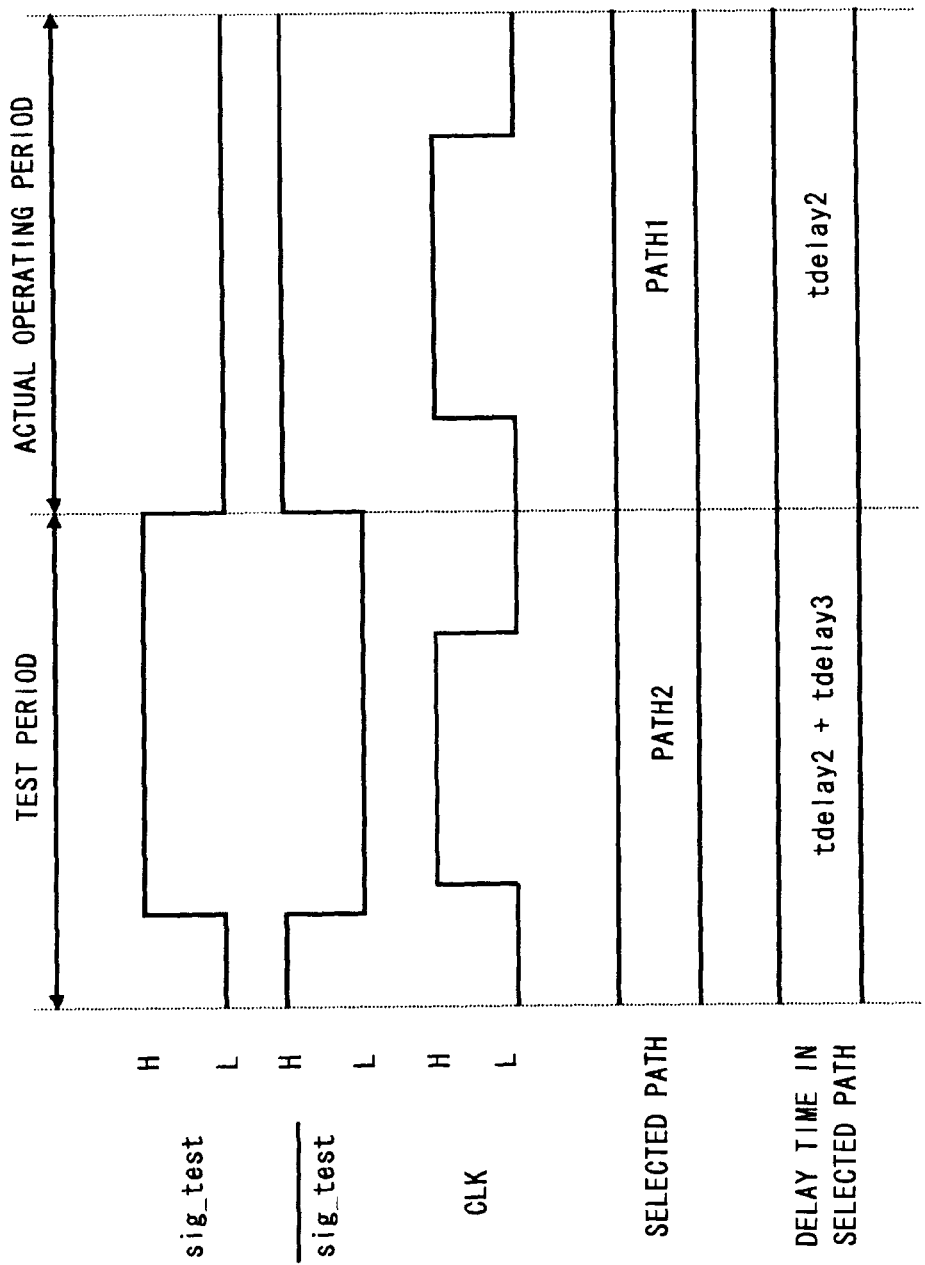
FIG. 3 is a chart illustrating operations of the semiconductor integrated circuit according to the first exemplary embodiment of the present invention.
Figure 4A:
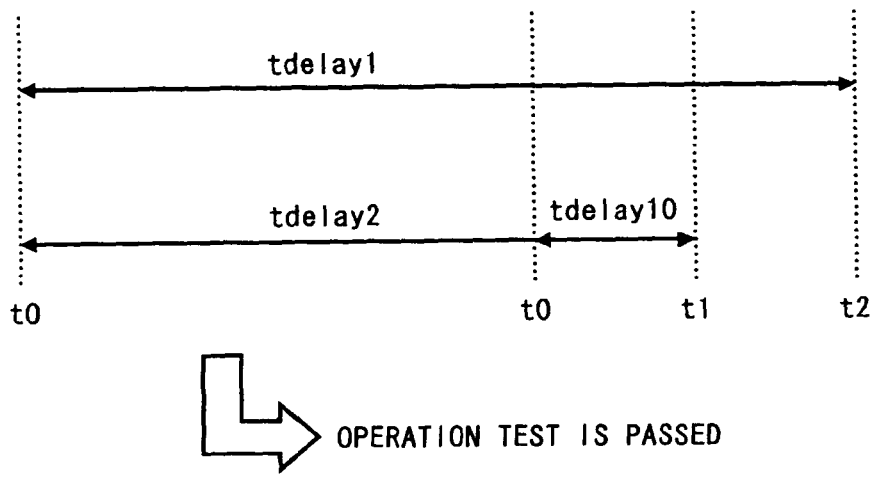
FIGS. 4A and 4B are explanatory diagrams each illustrating an effect of the first exemplary embodiment of the present invention.
Figure 4B:
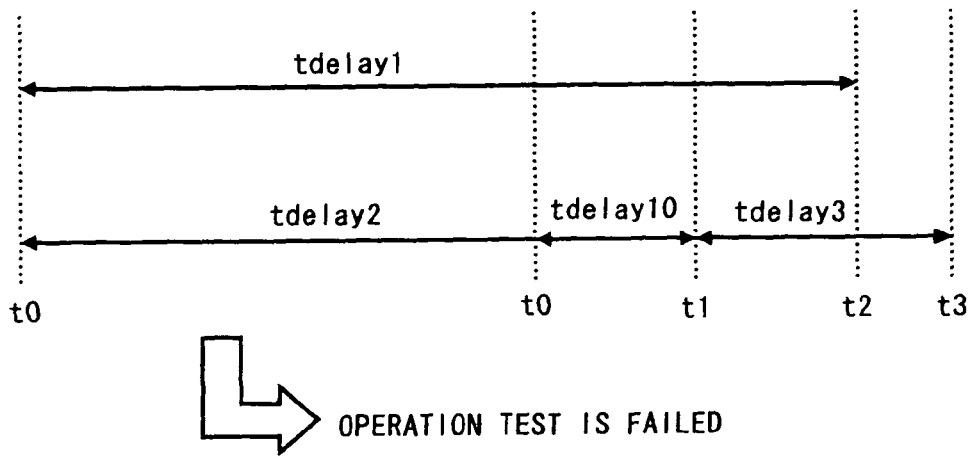

A first exemplary embodiment of the present invention will be described with reference to FIGS. 1 to 4B. FIG. 1 is a circuit diagram schematically showing a semiconductor integrated circuit. FIG. 2 is a flowchart illustrating a test process. FIG. 3 is a chart illustrating operations of the semiconductor integrated circuit. FIGS. 4A and 4B are explanatory diagrams each illustrating an effect of this exemplary embodiment.

As shown in FIG. 1, a semiconductor integrated circuit 100 includes a pulse generator 10, a logic circuit 12, a logic circuit 14, a test circuit 16, and a selector 18. Note that the pulse generator 10 includes an F/F (Flip/Flop) 10a and an F/F 10b. The test circuit 16 includes switches SW1 and SW2 and a delay circuit 20.

A description is given of connection relations between components provided in the semiconductor integrated circuit 100. The F/Fs 10a and 10b are each connected to a common clock CLK. The output of the F/F 10a is connected to an input "a" of the logic circuit 12. The output of the F/F 10b is connected to an input "a" of the logic circuit 14. An input "a" of the selector 18 is connected to an output "b" of the logic circuit 14. An input "b" of the selector 18 is connected to an output "c" of the logic circuit 14. An input "c" of the selector 18 is connected to an output "b" of the logic circuit 12 through the test circuit 16.

The output of the logic circuit 12 is connected to one end of the switch SW1 through a node N1, and is also connected to an input "a" of the delay circuit 20. An output "b" of the delay circuit 20 is connected to one end of the switch SW2. The other end of each of the switches SW1 and SW2 is connected to the input "c" of the selector 18 through a node N2. An output "d" of the selector 18 is connected to an output terminal T_out through another functional circuit (not shown).

The semiconductor integrated circuit 100 includes a path including the logic circuit 14 and a path including the logic circuit 12. The outputs of the paths are each connected to the selector 18 functioning as a common subsequent-stage circuit to which the paths are connected, and are in a racing condition. In this case, settings are made such that the output of the path including the logic circuit 12 reaches the selector 18 earlier than the output of the path including the logic circuit 14. Accordingly, if the output of the path including the logic circuit 14 is connected to the selector 18 earlier than the output of the path including the logic circuit 12 by accident, the output of the selector 18 becomes unstable, with the result that the semiconductor integrated circuit 100 may not operate normally.

In this exemplary embodiment, the test circuit 16 is connected between the logic circuit 12 and the selector 18. This makes it possible to check, in a normal operation test for the semiconductor integrated circuit 100, whether there is a sufficient time difference between timings at which the outputs of the racing paths are connected to the selector 18. This point will be more apparent from the following description.

The logic circuit 12 operates in response to a pulse output from the F/F 10a. The logic circuit 14 operates in response to a pulse output from the F/F 10b. The logic circuits 12 and 14 are functional circuits having typical multi-stage logic gates (NOT, OR, AND, and XOR) connected to each other. It is herein assumed that the logic circuit 12 outputs a select signal (control signal) for determining a select operation of the selector 18. The logic circuit 14 outputs data 1 and data 2 which are objects to be selected by the selector 18. Note that, as schematically shown in FIG. 1, a delay time (a time difference between a pulse input and a data output) of the logic circuit 12 is represented by tdelay2. A delay time (time difference between pulse input and select signal output) of the logic circuit 14 is represented by "tdelay1".

The selector 18 selects the data 1 or data 2 in response to the select signal transmitted from the logic circuit 12, and outputs the selected data. When the select signal is at H level, for example, the selector 18 selects and outputs the data 1. When the select signal is at L level, for example, the selector 18 selects and outputs the data 2.

The test circuit 16 is connected between the logic circuit 12 and the selector 18. The test circuit 16 includes two internal paths Path1 and Path2 connected in parallel with each other. The internal paths Path1 and Path2 are connected to each other at the nodes N1 and N2. The internal path Path1 is provided with the switch SW1. The internal path Path2 is provided with the delay circuit 20 and the switch SW2.

The delay circuit 20 is formed of, for example, multi-stage buffers connected to each other. Note that the specific configuration of the delay circuit 20 may be arbitrarily designed. As schematically shown in FIG. 1, a delay time (a time difference between a select signal input and a select signal output) of the delay circuit 20 is represented by "tdelay3". The switches SW1 and SW2 are, for example, transfer switches formed of MOS (Metal Oxide Semiconductor) switches. The specific configuration of each of the switches SW1 and SW2 may be arbitrarily designed.

The switches SW1 and SW2 are connected to control signals (sig_test, sig_test_bar), respectively, which are complementary to each other during a normal operation period and a test operation period. Thus, a desired internal path is selected as a propagation path for the select signal during the normal operation period and the test operation period.

Referring to FIGS. 2 and 3, a test process and operations of the semiconductor integrated circuit will be described.

As shown in FIG. 2, a test mode is first set (S1). Specifically, as shown in FIG. 3, the control signal sig_test is set to the high level. As a result, the switch SW2 turns on and the switch SW1 turns off. That is, the internal path Path2 is selected as the propagation path for the select signal. On the contrary, the internal path Path1 is not selected as the propagation path for the select signal.

Next, an operation test is carried out (S2). Specifically, as shown in FIG. 3, the clock CLK is caused to rise so that a pulse from the pulse generator 10 is supplied to each of the logic circuits 12 and 14. It is assumed herein that the pulse from the pulse generator 10 is supplied to each of the logic circuits 12 and 14 at substantially the same timing. Then, the logic circuits 12 and 14 perform predetermined operations. Further, a select signal to be connected to the selector 18 is output from the logic circuit 12. Furthermore, the data 1 and 2 to be connected to the selector 18 are output from the logic circuit 14.

Next, it is checked whether the semiconductor integrated circuit 100 is a non-defective product or not (S3). Specifically, it is checked whether the semiconductor integrated circuit 100 operates normally or not.

In this case, in order to secure the functions of the semiconductor integrated circuit 100, it is necessary to connect the output of the logic circuit 12 to the selector 18 earlier than the output of the logic circuit 14. When the output of the logic circuit 12 is connected to the selector 18 with a delay from the output of the logic circuit 14, the semiconductor integrated circuit 100 does not operate as intended. Thus, it is determined that the semiconductor integrated circuit 100 is a defective product.

In this exemplary embodiment, the output of the logic circuit 14 is connected to the selector 18 through the internal path Path2 during the test. As described above, the internal path Path2 includes the delay circuit 20. The delay amount of the delay circuit 20 is larger than the delay amount of the internal path Path1. Accordingly, a delay equal to or larger than that obtained during the normal operation can be added to the select signal during the test.

In this manner, the arrival time of the select signal at the selector 18 is intentionally delayed, thereby making it possible to check in the test whether there is a sufficient time difference between the timings at which the outputs of the racing paths are connected to the selector 18. If there is no sufficient time difference between the timings to be compared, the select signal may be connected to the selector 18 with a delay from the data 1 and 2 under the influence of the delay occurring in the delay circuit 20. In this case, as a result of the normal operation test, the semiconductor integrated circuit 100 is handled as a defective product. As a result, the product having no sufficient time difference between the timings to be compared is excluded from the non-defective products. This effectively enhances the reliability of the semiconductor integrated circuit including the racing circuit.

Note that, as shown in FIG. 3, the control signal sig_test is set to the L level during the normal operation. Then, the internal path Path1 is selected as the propagation path for the select signal.

Referring lastly to FIG. 4, effects of this exemplary embodiment will be described.

FIG. 4A shows a case where, when an unexpected delay (tdlay10) occurs in the logic circuit 12 with the configuration in which the output "b" of the logic circuit 12 is directly connected to the input "c" of the selector 18 without involving the test circuit 16, the semiconductor integrated circuit 100 is determined as a non-defective product in the operation test.

Like in this exemplary embodiment, FIG. 4B shows a case where, when the unexpected delay (tdelay10) occurs in the logic circuit 12 with a configuration in which the output "b" of the logic circuit 12 is connected to the input "c" of the selector 18 through the test circuit 16, the semiconductor integrated circuit 100 is determined as a defective product in the operation test.

In the case where the test circuit 16 (especially, delay circuit 20) is not provided as shown in FIG. 4A, even when the time difference between a time t1 and a time t2 becomes smaller as a result of the unexpected delay (tdelay10) occurring in the logic circuit 12, the semiconductor integrated circuit 100 is determined as a non-defective product in the test. In such a case, when the function of the racing circuit becomes unstable, the semiconductor integrated circuit 100 may cause a malfunction.

In the case where the test circuit 16 (delay circuit 20) is provided as shown in FIG. 4B, when the unexpected delay (tdelay10) occurs in the logic circuit 12, the delay time (tdelay3) occurring in the delay circuit 20 is added, with the result that the semiconductor integrated circuit 100 is determined as a defective product in the test. Thus, the product having no sufficient time difference between the timings at which the racing outputs of the paths are connected to the selector 18 can be handled as a defective product, in the normal operation test for the semiconductor integrated circuit 100. This enhances the reliability of the semiconductor integrated circuit 100 including the racing circuit.

[Second Exemplary Embodiment]

Figure 5:
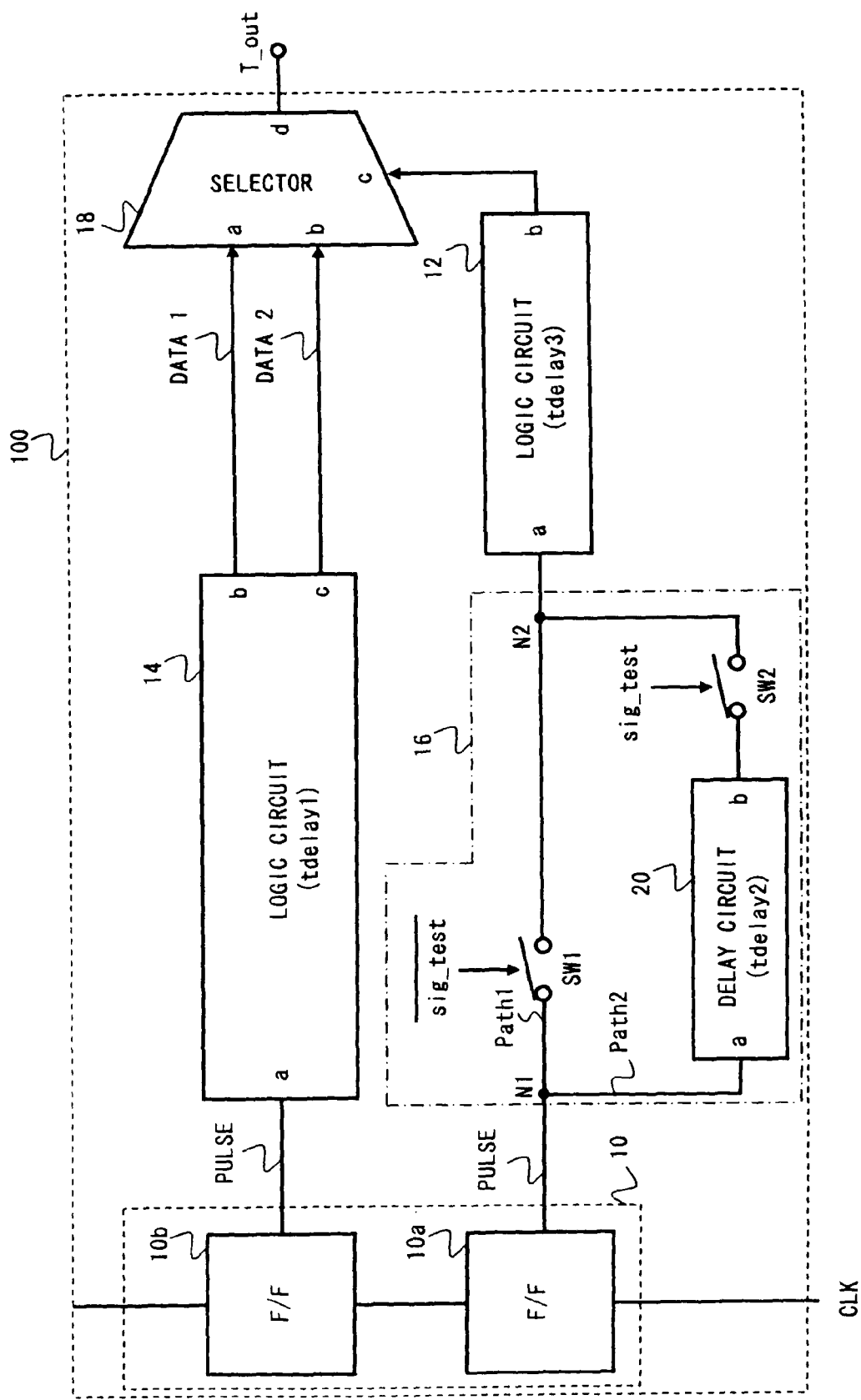
FIG. 5 is a circuit diagram schematically showing a semiconductor integrated circuit according to a second exemplary embodiment of the present invention

A second exemplary embodiment of the present invention will be described with reference to FIG. 5. FIG. 5 is a circuit diagram schematically showing a semiconductor integrated circuit according to this exemplary embodiment.

Unlike the first exemplary embodiment of the present invention, the test circuit 16 is connected between the logic circuit 12 and the pulse generator 10. Also in this case, the same effects as those of the first exemplary embodiment can be obtained. Note that operations of the semiconductor integrated circuit 100 according to this exemplary embodiment are apparent from the above description. Accordingly, a repeated explanation thereof is omitted.

[Third Exemplary Embodiment]

Figure 6:
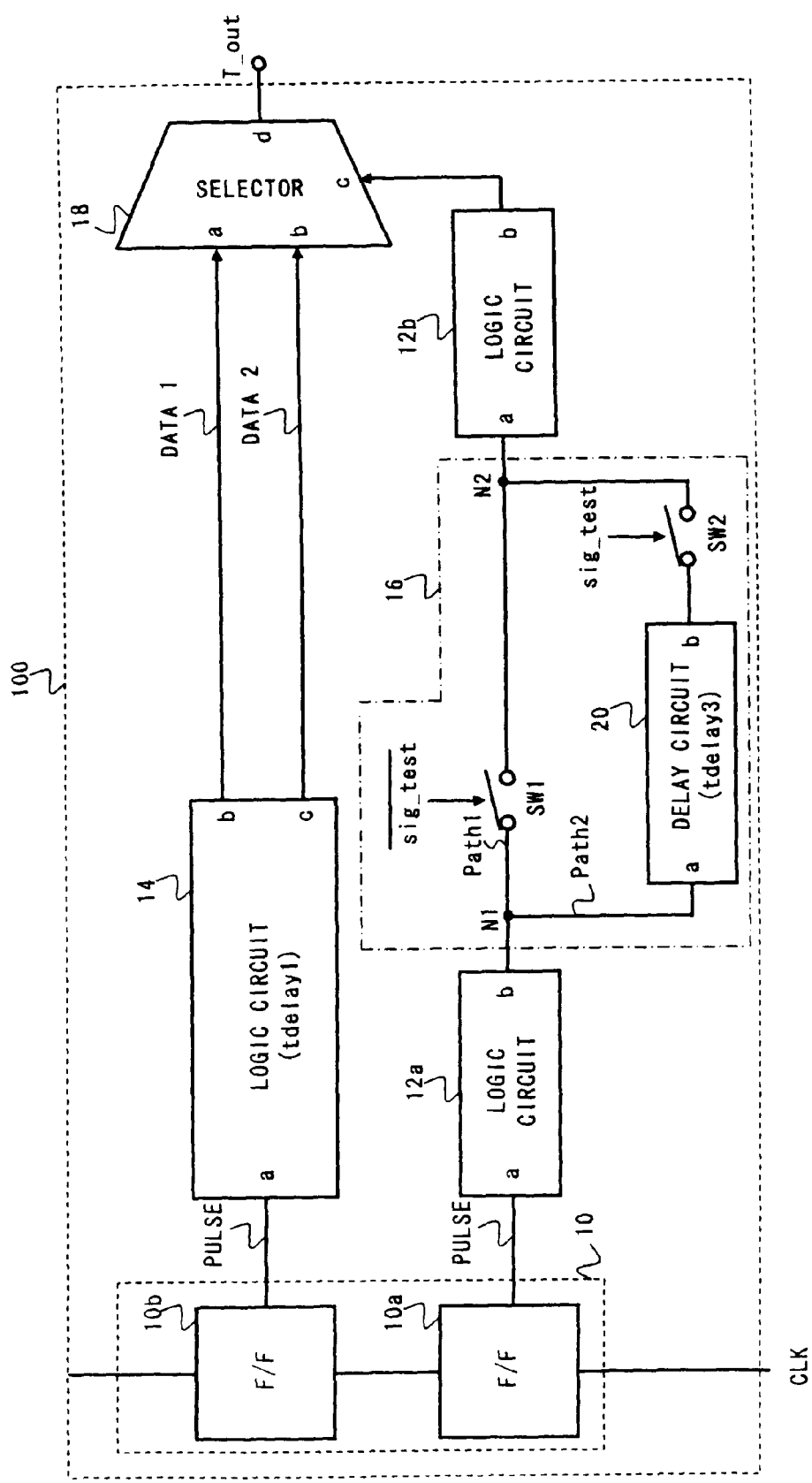
FIG. 6 is a circuit diagram schematically showing a semiconductor integrated circuit according to a third exemplary embodiment of the present invention.

A third exemplary embodiment of the present invention will be described with reference to FIG. 6. FIG. 6 is a circuit diagram schematically showing a semiconductor integrated circuit according to this exemplary embodiment.

The semiconductor integrated circuit of this exemplary embodiment differs from that of the first exemplary embodiment in that the logic circuit 12 is divided into a logic circuit 12a and a logic circuit 12b. Further, the test circuit 16 is connected between the logic circuit 12a and the logic circuit 12b. Also in this case, the same effects as those of the first exemplary embodiment can be obtained. Note that operations of the semiconductor integrated circuit 100 according to this exemplary embodiment are apparent from the above description. Accordingly, a repeated explanation thereof is omitted.

[Comparative Exemplary Embodiment]

A comparative exemplary embodiment of the present invention will be described with reference to FIG. 7.

Figure 7:
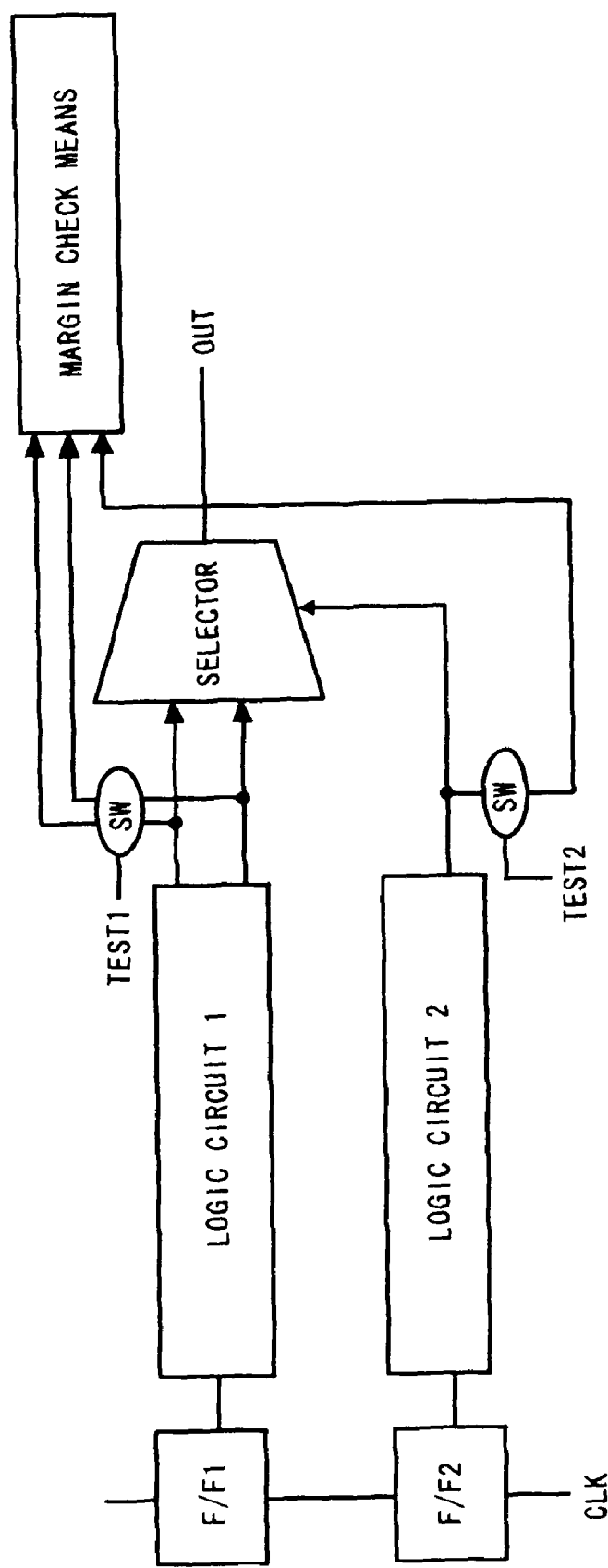
FIG. 7 is a schematic diagram showing the configuration of a circuit according to a comparative example of the present invention.

In the case of a circuit shown in FIG. 7, TEST1 is first set to the high level during a test, and the output timing of an output signal from the logic circuit 1 is monitored by margin check means. Next, TEST2 is set to the high level, and the output timing of an output signal from the logic circuit 2 is monitored by the margin check means. Then, the margin check means determines whether there is a sufficient time difference between an output time point of the output from the logic circuit 1 and an output time point of the output from the logic circuit 2.

When it is determined that there is a sufficient time between both time points to be compared, it can be determined that the circuit operation is not impaired by racing. When it is determined that there is no sufficient time between both time points to be compared, it can be determined that the circuit operation may be impaired by racing.

The margin check means incorporated in a semiconductor integrated circuit in this manner enables checking whether there is a sufficient time difference between timings at which the outputs of racing paths are connected to a selector. Thus, the reliability of the semiconductor integrated circuit including the racing circuit can be enhanced. In this case, however, it is necessary to incorporate a margin check step in a normal test process. This increases the time required for the test process, and may inhibit the cost reduction of the semiconductor integrated circuit to be tested.

According to the above exemplary embodiments, it is possible to check, in a normal test process, whether there is a sufficient time difference between the timings at which the outputs of racing paths are connected to a subsequent-stage circuit. This eliminates the need of adding a new step to the existing test process. As a result, a semiconductor integrated circuit of high reliability and low cost can be realized.

The embodiments of the present invention are not limited to the above-mentioned exemplary embodiments. The specific configuration of the logic circuit can be arbitrarily selected. The specific configuration of the subsequent-stage circuit can be arbitrarily designed. Any types of information can be transmitted through the paths. The number of paths to be connected to the subsequent-stage circuit is arbitrarily designed. The first to third exemplary embodiments of the present invention can be combined together.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:
1. A semiconductor integrated circuit comprising:
a first path that includes a first logic circuit;
a second path that includes a second logic circuit; and a subsequent-stage circuit that is connected to an output of the first path and is connected to an output of the second path, wherein the second path further comprises:

a first internal path that is selected as a propagation path during a normal operation period; and a second internal path that is selected as a propagation path during a test operation period and includes a delay circuit having a delay amount larger than a delay amount of the first internal path.

2. The semiconductor integrated circuit according to claim 1, further comprising:

a first switch that is provided in the first internal path; and a second switch that is provided in the second internal path, wherein control signals complementary to each other between the normal operation period and the test operation period are supplied to the first switch and the second switch.

3. The semiconductor integrated circuit according to claim 1, further comprising a clock generation circuit that generates a clock to be input to the first logic circuit and the second logic circuit at substantially the same timing.

4. The semiconductor integrated circuit according to claim 1, wherein an output of the first logic circuit is directly connected to the subsequent-stage circuit, and an output of the second logic circuit is connected to the subsequent-stage circuit through one of the first internal path and the second internal path.

5. The semiconductor integrated circuit according to claim 1, wherein the first logic circuit supplies a plurality of signals to the subsequent-stage circuit, and the subsequent-stage circuit selects and outputs at least one of the plurality of signals supplied from the first logic circuit in accordance with an output of the second logic circuit.

6. The semiconductor integrated circuit according to claim 1, wherein the first internal path is connected in parallel with the second internal path.

7. A test method comprising:

adding a delay larger than a delay that is caused during a normal operation period, to one of first and second paths that have logic circuits respectively, based on which output thereof is connected to a subsequent-stage circuit earlier;

testing an operation of a semiconductor integrated circuit including the first path, the second path, and the subsequent-stage circuit.

8. The test method according to claim 7, wherein, in a path selected to be added the delay, a first internal path selected as a propagation path during the normal operation period and a second internal path selected as a propagation path during the test operation period are connected in parallel.

9. The test method according to claim 8, wherein the first internal path is provided with a first switch, the second internal path is provided with a second switch, and wherein control signals complementary to each other between the normal operation period and the test operation period are supplied to the first switch and the second switch.

10. The test method according to claim 8, wherein the second internal path is incorporated in the semiconductor integrated circuit.

11. The test method according to claim 7, wherein the logic circuits respectively included in the first and second paths operate based on clocks input at substantially the same timing.

* * * * *